(12) United States Patent
Bao et al.

(10) Patent No.: US 9,536,830 B2
(45) Date of Patent: Jan. 3, 2017

(54) HIGH PERFORMANCE REFRACTORY METAL / COPPER INTERCONNECTS TO ELIMINATE ELECTROMIGRATION

(71) Applicant: International Business Machines Corporation, Armonk, NY (US)

(72) Inventors: Junjing Bao, Cedar Grove, NJ (US); Griselda Bonilla, Fishkill, NY (US); Samuel S. Choi, Fishkill, NY (US); Ronald G. Filippi, Wappingers Falls, NY (US); Naftali E. Lustig, Croton on Hudson, NY (US); Andrew H. Simon, Fishkill, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 107 days.

(21) Appl. No.: 13/890,642

(22) Filed: May 9, 2013

(65) Prior Publication Data

US 2014/0332965 A1    Nov. 13, 2014

(51) Int. Cl.
*H01L 23/528* (2006.01)
*H01L 23/532* (2006.01)

(52) U.S. Cl.
CPC ......... *H01L 23/528* (2013.01); *H01L 23/5283* (2013.01); *H01L 23/53238* (2013.01); *H01L 23/53266* (2013.01); *H01L 2924/0002* (2013.01)

(58) Field of Classification Search
CPC ................... H01L 23/53238; H01L 21/76877; H01L 21/76847; H01L 21/76849; H01L 23/5226; H01L 21/76843; H01L 23/53295; H01L 21/76834; H01L 21/76838; H01L 21/76852; H01L 23/528; H01L 23/5256; H01L 23/5329; H01L 23/53266; H01L 21/76886; H01L 2924/0002; H01L 21/02491; H01L 21/76807; H01L 21/76885; H01L 21/76889; H01L 21/76831; H01L 2221/1031; H01L 23/485; H01L 23/5222; H01L 21/02494; H01L 21/02502; H01L 21/76805; H01L 23/525
See application file for complete search history.

(56) References Cited

U.S. PATENT DOCUMENTS

| 4,707,723 A | 11/1987 | Okamoto et al. |
| 4,962,060 A | 10/1990 | Sliwa et al. |

(Continued)

FOREIGN PATENT DOCUMENTS

| CN | 102593098 A | 7/2012 |
| EP | 0704883 A2 | 4/1996 |
| WO | 2011146128 A1 | 11/2011 |

OTHER PUBLICATIONS http://hyperphysics.phy-astr.gsu.edu/hbase/tables/rstiv.html (Table of Resistivity).*

(Continued)

*Primary Examiner* — Steven Loke
*Assistant Examiner* — Juanita Rhodes
(74) *Attorney, Agent, or Firm* — Yuanmin Cai; Andrew M. Calderon; Roberts Mlotkowski Safran Cole & Calderon, P.C.

(57) ABSTRACT

An interconnect structure and method of making the same. A preferred interconnect structure has a first interconnect including a first dual damascene via and narrow line and a second interconnect at the same level as the first including a second dual damascene via and wider line. The first and second interconnects may have different aspect ratio and may have different line heights while being co-planar with each other. The second line of the second interconnect may abut or partially surround the first line of the first intercon- (Continued)

nect. The first interconnect includes a refractory metal material as the main conductor, whereas the second interconnect includes a lower resistivity material as its main conductor.

12 Claims, 8 Drawing Sheets

(56) References Cited

U.S. PATENT DOCUMENTS

| | | | |
|---|---|---|---|
| 5,208,170 A | 5/1993 | Kobeda et al. | |
| 5,223,456 A | 6/1993 | Malwah | |
| 5,300,813 A | 4/1994 | Joshi et al. | |
| 5,439,731 A | 8/1995 | Li et al. | |
| 5,470,788 A | 11/1995 | Biery et al. | |
| 5,976,975 A | 11/1999 | Joshi et al. | |
| 6,181,013 B1 | 1/2001 | Liu et al. | |
| 6,245,996 B1 | 6/2001 | Atakov et al. | |
| 6,294,464 B1 | 9/2001 | Trivedi | |
| 6,319,819 B1* | 11/2001 | Besser | H01L 21/76886 257/E21.591 |
| 6,376,358 B1 | 4/2002 | Fischer et al. | |
| 6,426,544 B1 | 7/2002 | Ryan et al. | |
| 6,566,242 B1 | 5/2003 | Adams et al. | |
| 6,597,067 B1 | 7/2003 | Biery et al. | |
| 6,678,951 B2 | 1/2004 | Atakov et al. | |
| 6,680,514 B1 | 1/2004 | Geffken et al. | |
| 6,975,032 B2 | 12/2005 | Chen et al. | |
| 7,115,999 B2 | 10/2006 | Tsumura et al. | |
| 7,259,463 B2 | 8/2007 | Huang et al. | |
| 7,307,344 B2 | 12/2007 | Minamihaba et al. | |
| 7,572,682 B2 | 8/2009 | Yang et al. | |
| 7,629,264 B2 | 12/2009 | Bonilla et al. | |
| 7,737,026 B2 | 6/2010 | Li et al. | |
| 7,745,810 B2 | 6/2010 | Rueckes et al. | |
| 7,790,617 B2 | 9/2010 | Lim et al. | |
| 7,851,357 B2 | 12/2010 | Cabral, Jr. et al. | |
| 7,923,283 B2 | 4/2011 | Awano | |
| 7,989,956 B1* | 8/2011 | Zhai | H01L 23/528 257/774 |
| 8,056,039 B2 | 11/2011 | Chanda et al. | |
| 8,101,505 B2 | 1/2012 | Abou-Khalil et al. | |
| 8,138,603 B2 | 3/2012 | Hsu et al. | |
| 8,211,776 B2 | 7/2012 | Horak et al. | |
| 8,232,646 B2 | 7/2012 | Bonilla et al. | |
| 8,237,142 B2 | 8/2012 | Cheung et al. | |
| 8,647,978 B1 | 2/2014 | Ott et al. | |
| 2002/0145201 A1* | 10/2002 | Armbrust | H01L 21/7682 257/776 |
| 2005/0189613 A1 | 9/2005 | Otsuka et al. | |
| 2007/0023914 A1 | 2/2007 | Farrar | |
| 2007/0045772 A1 | 3/2007 | Cheng et al. | |
| 2007/0063313 A1 | 3/2007 | Barth et al. | |
| 2007/0252237 A1 | 11/2007 | Ko et al. | |
| 2008/0296728 A1* | 12/2008 | Yang | H01L 23/5252 257/530 |
| 2009/0057818 A1 | 3/2009 | Kim et al. | |
| 2009/0206978 A1 | 8/2009 | Hwang et al. | |
| 2010/0021708 A1 | 1/2010 | Kong et al. | |
| 2010/0032797 A1 | 2/2010 | Takewaki | |
| 2010/0224956 A1 | 9/2010 | Kim et al. | |
| 2011/0006425 A1 | 1/2011 | Wada et al. | |
| 2011/0057322 A1 | 3/2011 | Matsunaga et al. | |
| 2011/0059599 A1 | 3/2011 | Ward et al. | |
| 2011/0076390 A1 | 3/2011 | Cerio, Jr. et al. | |
| 2011/0091647 A1 | 4/2011 | Colombo et al. | |
| 2011/0115094 A1 | 5/2011 | Darnon et al. | |
| 2011/0175226 A1* | 7/2011 | Bonilla | H01L 21/76802 257/751 |
| 2011/0298132 A1 | 12/2011 | Naeemi et al. | |
| 2011/0309507 A1 | 12/2011 | Darnon et al. | |
| 2012/0058350 A1 | 3/2012 | Long et al. | |
| 2012/0080796 A1 | 4/2012 | Wada et al. | |
| 2012/0104622 A1* | 5/2012 | Kim | H01L 21/76804 257/774 |
| 2012/0126363 A1 | 5/2012 | Wang et al. | |
| 2012/0139114 A1 | 6/2012 | Zhang et al. | |
| 2012/0181692 A1* | 7/2012 | Heinrich | H01L 21/76807 257/751 |
| 2012/0196434 A1 | 8/2012 | Thei et al. | |
| 2013/0026635 A1 | 1/2013 | Yang et al. | |
| 2013/0147008 A1 | 6/2013 | Poppe et al. | |
| 2013/0214252 A1 | 8/2013 | Park et al. | |

OTHER PUBLICATIONS

IP.com No. IPCOM000223293D Publication Date: Nov. 15, 2012 Title: Hybrid refractory metal-copper wiring metallization scheme for integrated circuits.

Wall et al., "A New Four-Level Metal Interconnect System Tailored to an Advanced 0.5-urn BiCMOS Technology", IEEE Transactions on Semiconductor Manufacturing, vol. 11, No. 4, Nov. 1998, pp. 624-635.

Hey et al., "Selective Tungsten on Aluminum for Improved VLSI Interconnects", 50-IEDM 86, 1986 IEEE, pp. 50-IEDM86-IEDM86-53.

Li et al., "Low-Temperature Growth of Graphene by Chemical Vapor Deposition Using Solid and Liquid Carbon Sources", vol. 5, No. 4, 2011, ACSNANO, www.acsnano.org., pp. 3385-3390.

Mattevi et al., "A review of chemical vapour deposition of graphene on copper", www.rsc.org/materials, Journal of Materials Chemistry, 2011, vol. 21, 3324-3334.

Xia et al., "The origins and limits of metal—graphene junction resistance", Nature Nanotechnology, vol. 6 Mar. 2011, www.nature.com/naturenanotechnology, pp. 179-184.

Inohara et al., "Copper Filling Contact Process to Realize Low Resistance and Low Cost Production fully Compatible to SOC devices", 2001 IEEE, IEDM 01-931-IEDM 01-933.

Li et al., "Bottom-up approach for carbon nanotube interconnects", Applied Physics letters, vol. 82, No. 15, Apr. 14, 2003, 2003 American Institute of Physics, pp. 2491-2493.

Paul et al., Synthesis of a Pillared Graphene Nanostructure: A Counterpart of Three-Dimensional Carbon Architectures, small 2010, vol. 6, No. 20, pp. 2309-2313, © 2010 Wiley-VCH Verlag GmbH & Co. KGaA, Weinheim, wileyonlinelibrary.com.

Filippi et al., U.S. Appl. No. 14/024,694, filed Sep. 12, 2013, entitled "E-Fuse With Hybrid Metallization".

Filippi et al., "Interconnect with hybrid metallization," U.S. Appl. No. 13/890,560, filed May 9, 2013.

Bao et al., "Hybrid Graphene-Metal Interconnect Structures", U.S. Appl. No. 13/873,356, filed Apr. 30, 2013.

Bao et al., "E-Fuse With Hybrid Metallization", U.S. Appl. No. 14/291,027, filed May 30, 2014.

Pending U.S. Appl. No. 14/480,718, entitled: "Multimetal Interlayer Interconnects", filed Sep. 9, 2014, 27 pages.

Sun et al., "Surface and grain-boundary scattering in nanometric Cu films", Physical Review B 81, 155454 (2010), DOI: 10.1103/PhysRevB.81.155454, pp. 155454-1-155454-12, The American Physical Society.

* cited by examiner

HIGH PERFORMANCE REFRACTORY METAL / COPPER INTERCONNECTS TO ELIMINATE ELECTROMIGRATION

BACKGROUND OF THE INVENTION

Field of the Invention

The present invention generally relates to metallization structures for integrated circuits on a semiconductor chip. In particular, the invention relates to interconnects with superior electromigration (herein "EM") resistance, these interconnects include a high conductivity interconnect portion abutting a refractory metal interconnect portion.

Description of Related Art

Metallization systems used in integrated circuits on a semiconductor chip include several levels of metal lines separated by dielectric layers and connected through the dielectric layers by metal vias.

Voids can appear in the metal lines and vias due to electromigration of the metal atoms. Electromigration is the movement of atoms due to a high electric current density. Atoms will move in one direction, while vacancies (empty atomic sites) move in the opposite direction. The result is accumulation of vacancies which form void(s) in the metal line or via and an accumulation of atoms which may form a hillock (a protrusion a metal atoms).

In older, less advanced technologies, metal lines are made of aluminum and the electromigration issue is addressed by making lines above a certain size (thereby minimizing current density) and sandwiching the aluminum line with a titanium layer to form a titanium-aluminum alloy which is resistance to atomic and vacancy flux.

In newer, more advanced technologies, metal lines are made of copper. As metal lines shrink, electromigration is once again emerging as a concern. Initially, electromigration was addressed by grain size engineering, namely growing large bamboo grains. The grain structure forces atomic and vacancy migration to the metal line/dielectric interface. Therefore, similar to the aluminum lines, alloys (CuMn, for example) are being proposed for the copper metal line/ dielectric interface to impede migration. However, merely alloying may not be sufficient as interconnect features continue to shrink in size and grow in number. In addition, with shrinking line widths, the volume of copper in the line shrinks which limits the current carrying capability of narrow lines. Thus, a more robust solution to electromigration in narrow lines which does not detract from the current carrying capabilities of the lines is desirable.

BRIEF SUMMARY OF THE INVENTION

The current invention provides a refractory metal material with low electron mean free path as a conductor in narrow metal lines while wider metal lines at the same or different levels retain copper as the primary conductor. A refractory metal ensures good electromigration behavior while at the same time is capable of carrying large current loads. In addition, a material with a low electron mean free path is not as susceptible to scattering and thus will not have its resistivity degraded as line widths are reduced. By employing this hybrid metallization scheme based on line width, the reliability of narrow lines is improved while simultaneously maintaining the low resistivity option in wide lines.

An object of the invention is to provide structures and methods of making a hybrid interconnect so that electromigration is mitigated at shrinking line widths.

According to an aspect of the invention, a structure includes a first interconnect including a first line overlying a first via, and a second interconnect including a second line overlying a second via. The interconnects are made from different materials and the lines are coplanar.

According to another aspect of the invention, a hybrid interconnect structure is made by forming a first opening in a dielectric, the first opening including a first line opening in communication with a first via opening. The first opening is lined with a first liner and filled with a first conductor which is polished to be co-planar with the dielectric. A second opening is made in the dielectric, the second opening including a second line opening in communication with a second via opening. The second opening is lined with a second liner and filled with a second conductor. The second liner and conductor are made co-planar with the dielectric, the first conductor, and a portion of the first liner.

According to a further aspect of the invention, a first damascene line is formed having a first conductor material and a second damascene line is formed having a second conductor material. The second line has a width greater than the first line.

An advantage of the present invention is that a robust interconnect structure can be obtained by using a hybrid metallization scheme.

Another advantage of the present invention over other techniques is the ability to carry large currents on narrow line widths without electromigration while at the same time maintaining low resistivity on wider line widths.

Another advantage of the present invention is that EM failure by via depletion, in addition to line depletion is mitigated by having a dual damascene refractory metal structure at minimum line widths.

Another advantage of a method of the present invention is that it forms a structure which includes lines at the same level that can have independent aspect ratios.

A further advantage of the present invention is that resistance tuning can be achieved by independently varying the height of the refractory metal narrow line. This can be used to prevent unwanted voltage drops in sensitive interconnect layers.

Other characteristics and advantages of the invention will become obvious in combination with the description of accompanying drawings, wherein the same number represents the same or similar parts in all figures.

DETAILED DESCRIPTION OF THE INVENTION

The basic principle of the invention includes methods of making a hybrid interconnect structures. The methods result in structures which have a first interconnect (including a first line and first via), a second interconnect (including a second line and a second via), preferably in the same level and co-planar. The first interconnect is made of a first conductor material and the second interconnect is made of a second conductor material. The first line and the second line have different widths and may have different heights and aspect ratios. The first and second lines may directly contact each other.

Figure 1:
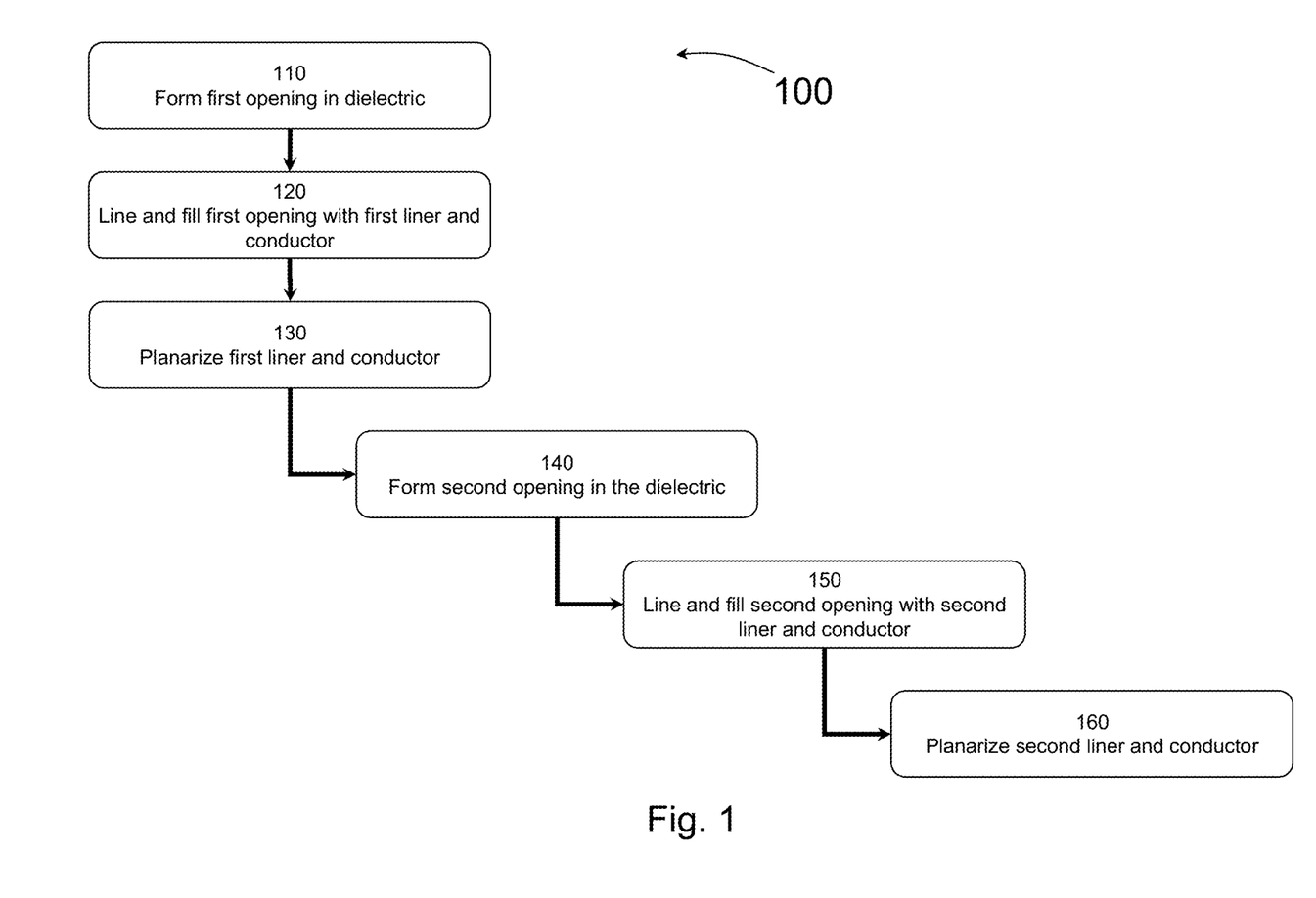
FIG. 1 is a flow chart 100 of the steps of forming a hybrid interconnects structure according to one embodiment of the present invention.

FIG. 1 is a flow chart 100 of the steps of forming a hybrid interconnects structure according to a preferred embodiment. Step 110 is forming a first opening in a dielectric; step 120 is lining and filling the first opening with a first liner and first conductor; step 130 is planarizing the first liner and first conductor; step 140 forming a second opening in the dielectric; step 150 is lining and filling the second opening with a second liner and second conductor; step 160 is planarizing the second liner and second conductor. Each of the steps, and the resulting structures, will be discussed in detail below.

Figure 2:
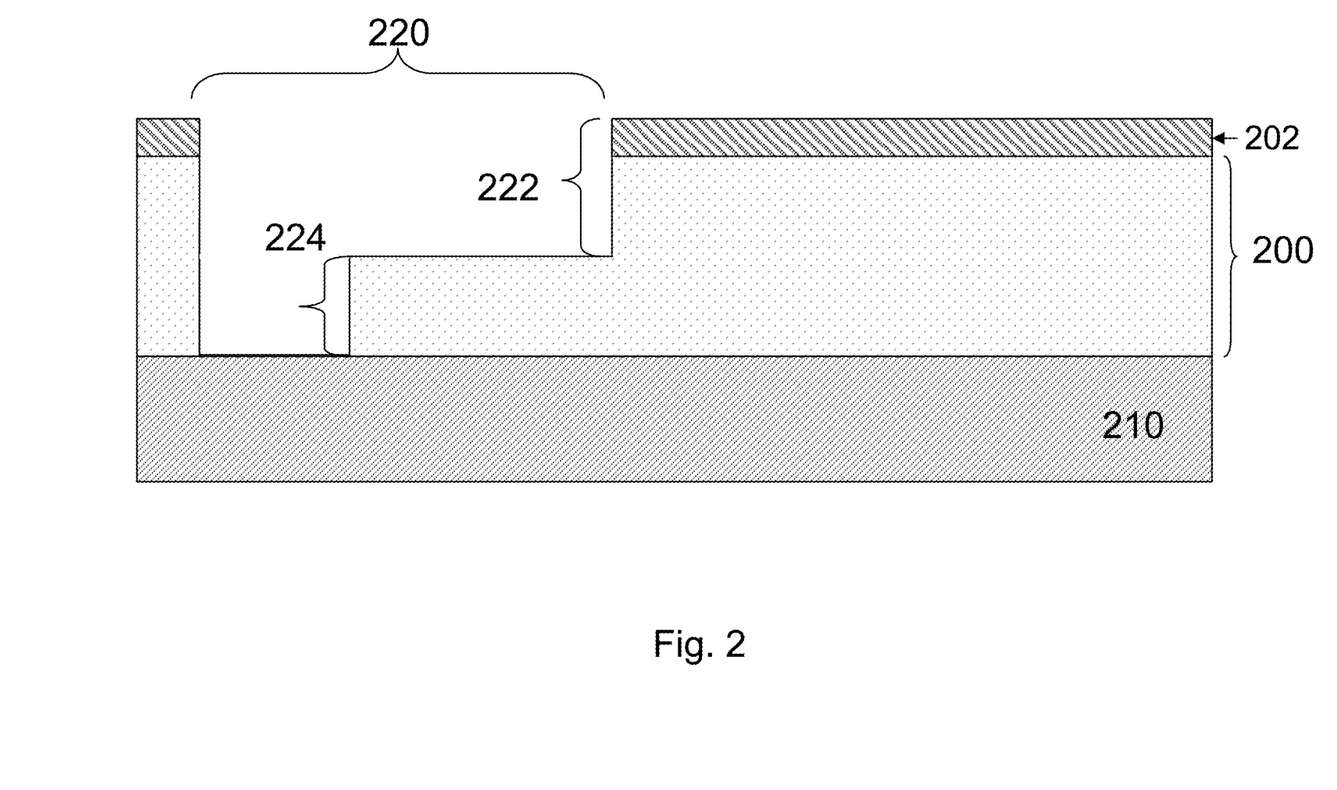
FIG. 2 illustrates, in cross section, forming a first opening in a dielectric according to an embodiment of the present invention.

FIG. 2 is a cross section illustration of forming a first opening in a dielectric according to an embodiment. A dielectric layer 200 is over substrate 210. Using standard lithography and reactive ion etching (herein "RIE") techniques a first interconnect opening 220 including a first via opening 224 and first line opening 222 is formed in the dielectric 200. The substrate 210, in most cases, is a preceding interconnection level of the device. However, the substrate can also be a contact level of a device or any prior surface which requires interconnects above it. The dielectric 200 can be any dielectric layer or more likely a combination of dielectric layers. In a preferred embodiment, the dielectric layer is a low dielectric constant material above a dielectric cap layer which may also function as an etch stop. By way of example and not limitation, the dielectric cap layer may include silicon and nitrogen containing materials or silicon and carbon containing materials or combinations thereof; for example silicon nitride ($Si_3N_4$), silicon carbide (SiC), silicon carbon nitride (SiCN) or hydrogenated silicon carbide (SiCH). Low dielectric constant materials are those with dielectric constant less than 4 and preferably less than 3.6. By way of example and not limitation, low dielectric constant materials include silicon-carbon-oxygen containing materials such as hydrogenated silicon carbon oxide (SiCOH), porous dielectric materials such as porous SiCOH, or organic materials. In yet another embodiment, the dielectric layer 200 includes a silicon and oxygen containing material having a dielectric constant around 4. FIG. 2 also illustrates a preferred, but not required, embodiment having a hardmask 202 above the dielectric 200. The hardmask 202 can include a single layer or multiple layers. In a preferred embodiment, hardmask 202 can act as a polish stop and/or an etch stop. In a preferred embodiment, the hardmask includes a silicon dioxide film, preferably from a TEOS precursor. The first via opening 224 and first line opening 222 can be formed in a via first or a via last process.

Figure 3:
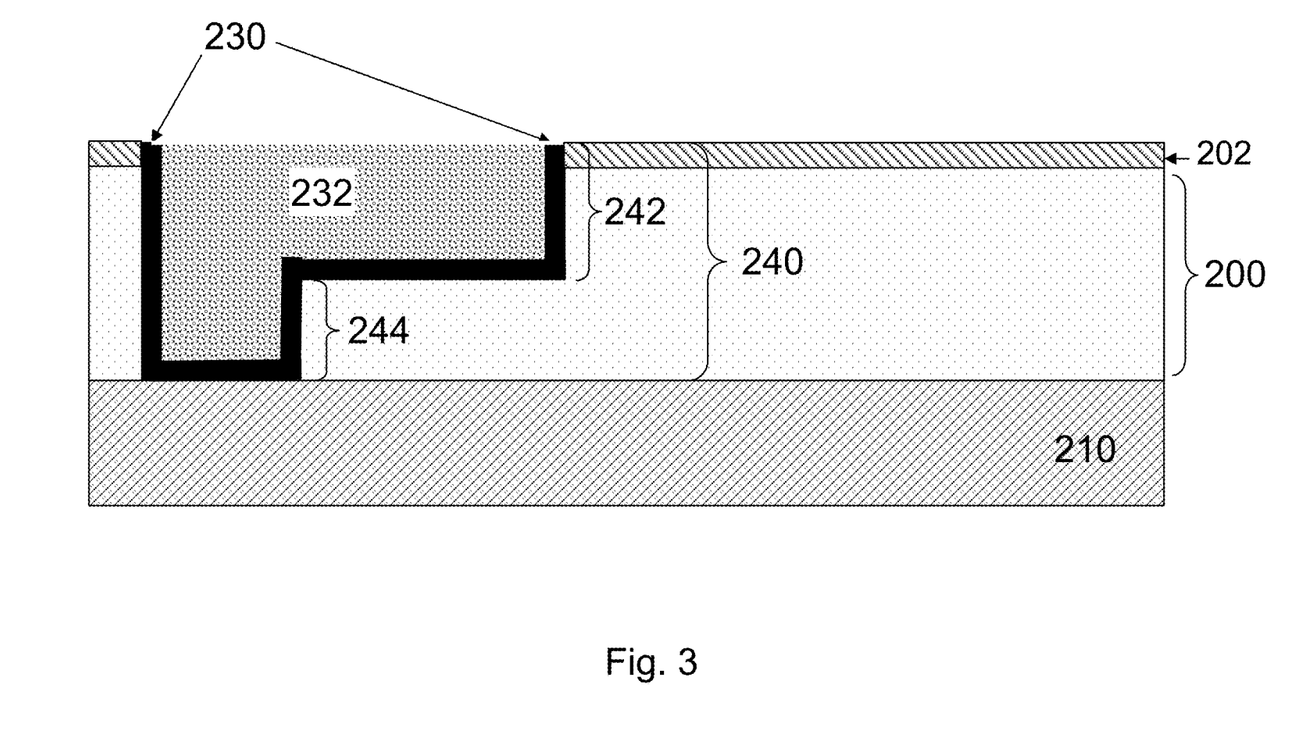
FIG. 3 illustrates, in cross section, lining, filling and planarizing the first liner and first conductor in the dielectric to form the first interconnect according to an embodiment of the present invention.

FIG. 3 is a cross section illustration after depositing and planarizing the first liner 230 and first conductor 232 in the dielectric 200 to form the first interconnect 240. In a preferred embodiment, chemical mechanical polishing is the planarization method, in such a case, hardmask 202 can act as a polish stop. The first interconnect 240 includes a first line 242 portion (former first line opening 222) and a first via 244 portion (former first via opening 224). The first liner 230 lines the former first line opening 222 and first via opening 224 and is in contact with dielectric 200. The first liner 230 can comprise one or more layers. The first liner 230 should perform at least one of the following functions: promote adhesion of the dielectric 200 and first conductor 232, and should prevent diffusion from the first conductor 232 to the dielectric 200 or vice versa. Thus, the identity of the first liner 230 can vary with the identity of the first conductor 232.

In a preferred embodiment, the first conductor 232 may include a refractory metal. Refractory metals include tungsten, niobium, molybdenum, tantalum or rhenium. The following elements are also sometimes considered refractory metals: titanium, vanadium, chromium, hafnium, ruthenium, zirconium, osnium, rhodium and iridium. Alternatively, first conductor 232 could be manganese nitride or cobalt. First conductor 232 may be an alloy of one of the previously mentioned materials. In a preferred embodiment, the first conductor 232 includes tungsten and the first liner 230 includes titanium and/or titanium nitride layer(s).

Figure 4:
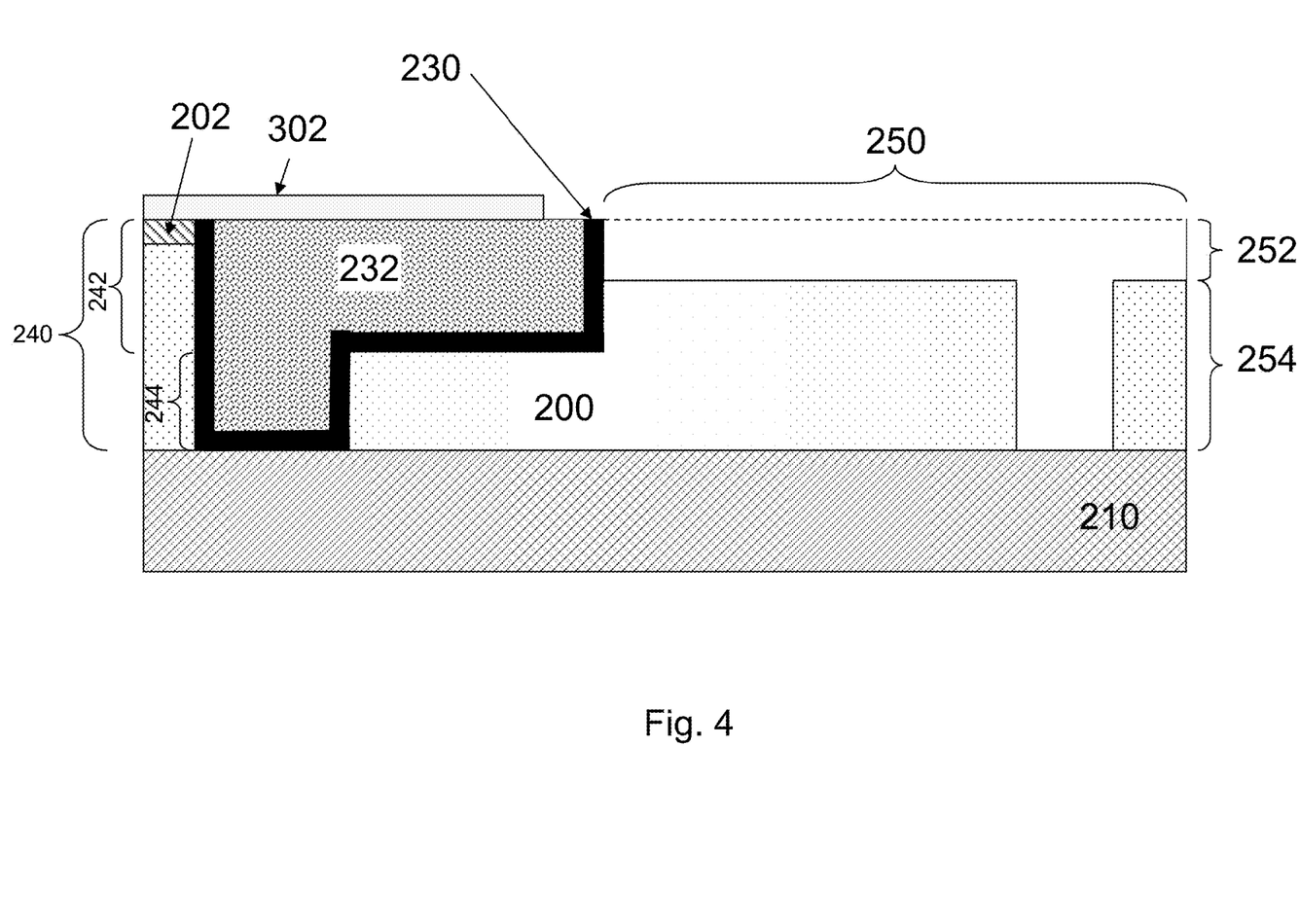
FIG. 4 illustrates, in cross section, forming a second opening in the dielectric according to an embodiment.
Figure 5:
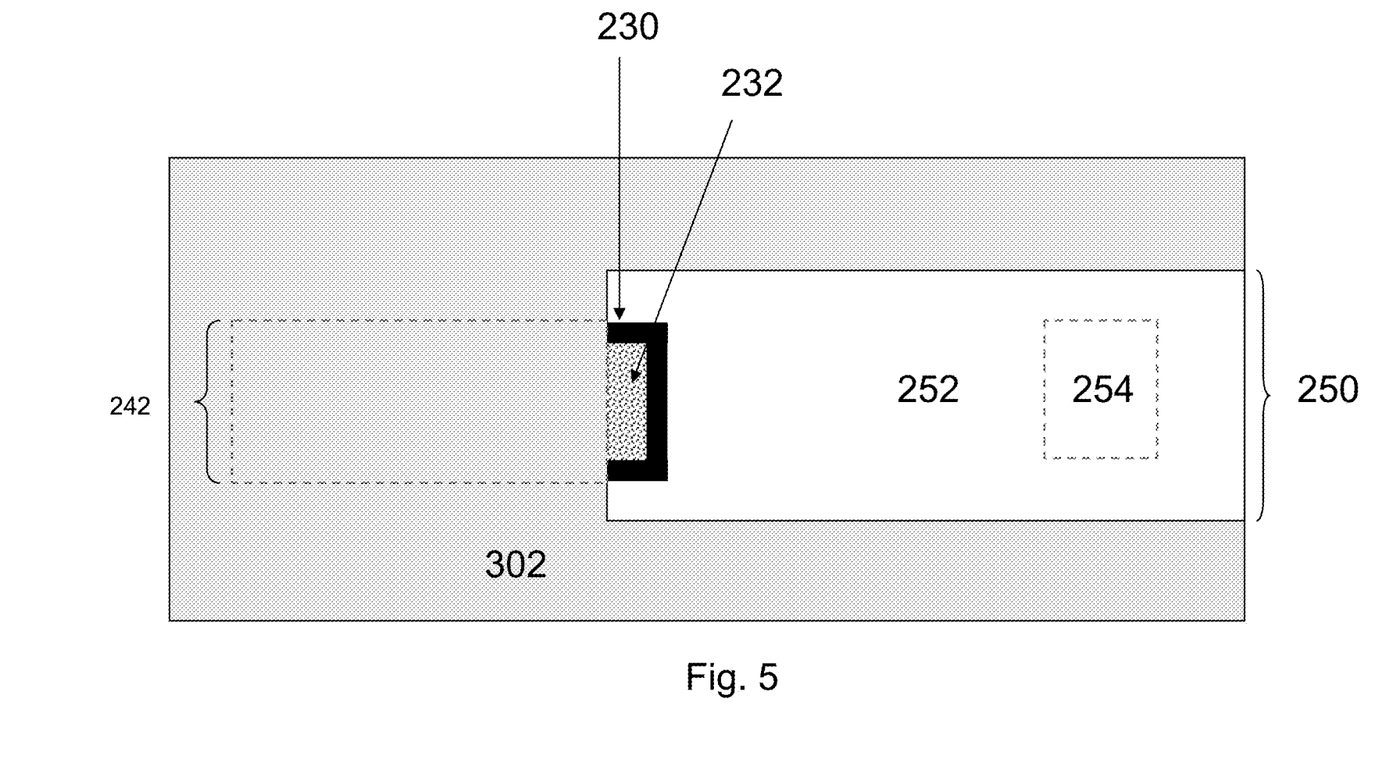
FIG. 5 is a top down illustration of first conductor and second interconnect opening according to an embodiment of the present invention.

FIG. 4 is a cross section illustration of forming a second opening in the dielectric prior to second metallization according to an embodiment. The second interconnect opening 250 includes a second via opening 254 and second line opening 252 formed in the dielectric 200. The second via opening 254 and second line opening 252 can be formed in a via first or a via last process. The embodiment shown in FIG. 4 was made in a via last process. In a via last process line hardmask 302 is formed over the entire substrate and opened in areas where the second line opening 252 in the dielectric 200 will be. The line hardmask 302 can include one or more dielectric or conducting films or combinations thereof. By way of example and not limitation, line hardmask may include silicon dioxide, silicon nitride, tantalum, tantalum nitride, titanium, titanium carbide, or titanium nitride. As seen in FIG. 4, sometimes the opening in the line hardmask 302 overlaps with the first line 242 portion, such that a region of first line portion 242 adjacent second line opening 252 is not covered by the line hardmask 302. In such a situation, while not illustrated in FIG. 4, a top corner of the first line portion 242 adjacent second interconnection opening 250 (and in particular, adjacent to second line opening 252) can be faceted as result of the second line opening etch. Thus, a portion of first liner 230 may be missing or reduced in this region. In addition, a portion of first conductor 232 may be missing or reduced in the faceted region. FIG. 5 is a top down view of FIG. 4. The dotted line on the left represents first line portion 242 under the line hardmask 302. The dotted line on the right represents second via opening 254 of the second opening 250. Note that the embodiment illustrated in FIG. 5 has a second line opening 252 wider than first line portion 242.

Figure 6:
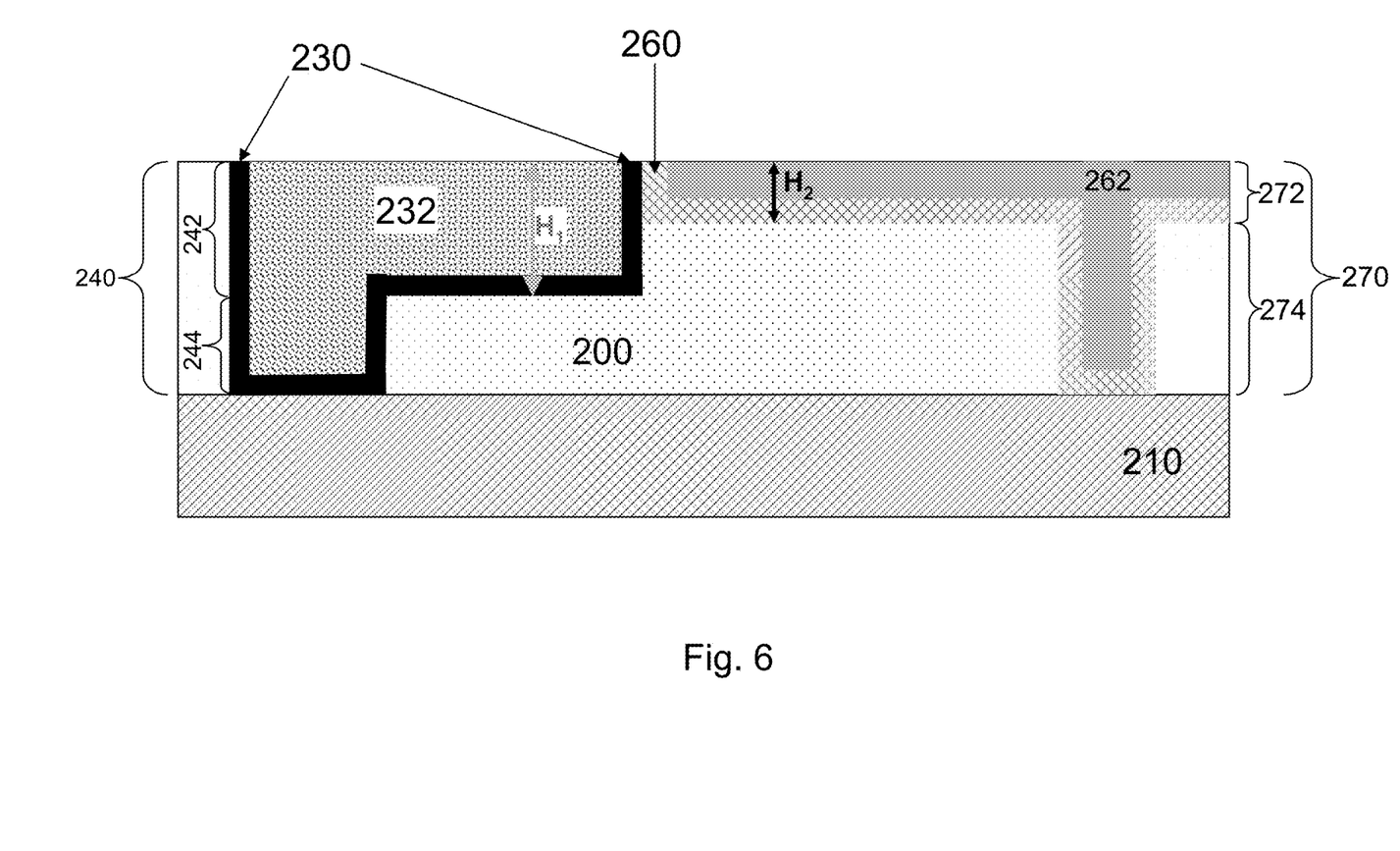
FIG. 6 illustrates, in cross section, lining, filling and planarizing the second liner and second conductor in the dielectric to form the second interconnect according to an embodiment of the present invention.

FIG. 6 is a cross section illustration after lining, filling and planarizing the second liner 260 and second conductor 262 in the second opening of dielectric 200 to form the second interconnect 270. The second interconnect 270 includes a second line 272 portion (former second line opening 252) and a second via 274 portion (former second via opening 254). The second liner 260 lines the former second line opening 252 and second via opening 254 and is in contact with dielectric 200, substrate 210, and first liner 230. The second liner 260 can comprise one or more layers. The second liner 260 should perform at least one of the following functions: promote adhesion of the dielectric 200 and second conductor 262, and should prevent diffusion from the second conductor 262 to the dielectric 200 or vice versa. Thus, the identity of the second liner 260 can vary with the identity of the second conductor 262. In a preferred embodiment, the second liner includes a tantalum nitride layer and a tantalum layer. Other liner materials in lieu or in addition to preferred materials include but are not limited to manganese containing layers, aluminum containing layers, ruthenium containing layers or cobalt containing layers. The second conductor 262 is a low resistivity metal or metal alloy in comparison to the first conductor 232. In a preferred embodiment, the second conductor includes copper or copper doped with another metal, for example, but not limitation, manganese, aluminum, cobalt or ruthenium.

Referring to FIG. 6, during planarization of the second interconnect 270, the first interconnect 240 is at least partially covered by line hardmask 302 in a preferred embodiment, or by the second liner 260 in embodiments not using a line hardmask 302. Thus, galvanic exposure of the first interconnect 240 is minimized. Optionally, to further minimize galvanic corrosion of the first interconnect 240, the second liner 260 may be removed by a dry etch, for example RIE, rather than a polish in a slurry. Thus, in some embodiments, second liner 260 may be removed in a non-aqueous environment to avoid the possibility of galvanic corrosion. In a preferred embodiment, the planarization process removes most or all of hardmask 202, thus FIG. 6 illustrates a preferred embodiment in which the interconnects are co-planar with dielectric layer 200, rather than co-planar with any remaining hardmask 202.

Still referring to FIG. 6, as mentioned earlier with respect to FIG. 4, a top corner of first line portion 242 adjacent the second line 272 may be faceted. While the faceting is not shown in FIG. 6, it will be appreciated, that the faceting may result in second liner 260 being in contact with not only first liner 230, but also in contact with a first conductor 232.

Again referring to FIG. 6, a preferred embodiment is shown in which the height ($H_1$) of the first line 242 is greater than the height ($H_2$) of the second line 272. It is also contemplated that the first and second lines, 242 and 272 respectively, have the same height. In either of these embodiments (equal heights or varying heights), the lines are substantially co-planar. Note, that in another embodiment contemplated wherein the first line and second line are on different levels (Mx and Mx+1, respectively, for example), the first and second lines will not be co-planar with each other, but will be co-planar with other metal lines in their respective levels.

Being able to independently control the heights of the first 242 and second 272 lines is a source of a distinct advantage of the present invention: the ability to tune resistance and any associated voltage drop. With respect to resistance, the first line 242 is narrower than the second line 272, and the first line is preferably made of tungsten, a higher resistivity material than copper (the conductor of the second line 272). Accordingly, if the lines had the same height, the first line 242 would have higher resistance than the second line 272, and, resistive circuit delay may be introduced. However, because the height ($H_1$) of the first line 242 is independent of the height ($H_2$) of the second line 272, the first height ($H_1$) can be larger and thus the resistance of the first line 242 reduced. Thus, any signal delay caused by using a high resistivity material in a narrow line is mitigated. Voltage drop is also affected by the choice of materials, line widths and line heights in an analogous manner.

Figure 7:
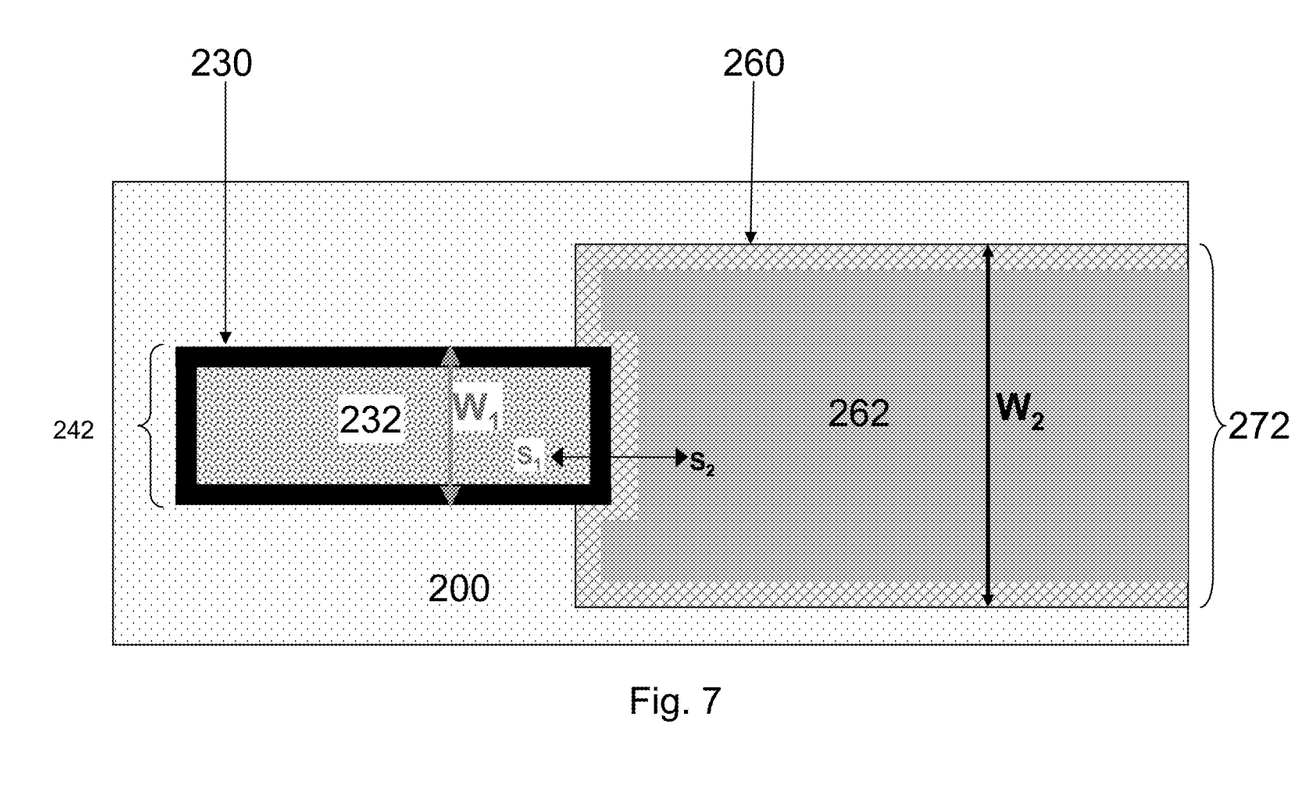
FIG. 7 is a top down illustration of first conductor and second conductor according to an embodiment of the present invention.

Referring to FIG. 7, a preferred embodiment is shown in which the width ($W_1$) of the first line 242 is less than the width ($W_2$) of the second line 272. Thus, the first line 242 and second line 272 can have independent aspect ratios even though they exist in the same dielectric 200 (i.e. are in the same metal level). Furthermore, when the lines have different and independent aspect ratios, the first and second vias (244 and 274, respectively) will also have different aspect ratios which are independent of each other despite being in the same metal level.

Generally speaking, narrow lines which are candidates for the refractory metal first conductor material 232 are lines having a width of equal to or less than about 40 nm, 35 nm, 30 nm, 25 nm, 20 nm, 15 nm, 10 nm, and 5 nm and widths therebetween. In one embodiment, line widths which are candidates for the refractory metal first conductor 232 are lines that are less than three times the minimum lithographic width for that node, whereas low resistivity second conductors 262 are lines that are greater than or equal to three times the minimum line width for that node. In another embodiment, line widths which are candidates for the refractory metal first conductor 232 are lines that are less than two times the minimum lithographic width for that node, whereas low resistivity second conductors 262 are lines that are greater than or equal to two times the minimum line width for that node. In a preferred embodiment, line widths which are candidates for the refractory metal first conductor 232 are lines that are equal to the minimum lithographic width for that technology node, whereas low resistivity second conductors 262 are lines that are greater than or equal to three times the minimum line width for that node. Table 1 below is an example of expected minimum line widths at each node.

TABLE 1

| Line widths by node | | | |
| --- | --- | --- | --- |
| Technology node (nm) | Minimum width line (nm) | 3x width line (nm) | Pitch (nm) |
| 22 | 40 | 120 | 80 |
| 14 | 32 | 96 | 64 |
| 10 | 22 | 66 | 44 |
| 7 | 16 | 48 | 32 |
| 5 | 11 | 33 | 22 |

Referring again to FIG. 7, the second line 272 is aligned such that a portion of second line 272 wraps around an end of first line 242. Thus, in this embodiment, second liner 260 and first liner 230 contact each other on three sides of first line 242. The overlap is possible because first conductor/liner 232/230 is able to withstand the reactive ion etching used to create second opening 250. It is also possible that the overlay of first and second lines, 242 and 272 respectively, results in the two lines abutting each other rather than partial wrapping shown in FIG. 7. In either case, a line can be drawn ($s_1$ to $s_2$) that traces the materials where the two lines meet. Starting at point $s_1$ in FIG. 7 and moving to point $s_2$ the first material encountered is first conductor 232, followed by first liner 230, second liner 260 and second conductor 262. Thus, in a preferred embodiment, the materials from $s_1$ to $s_2$ are a refractory metal such as tungsten as first conductor 232, titanium nitride followed by titanium layers as first liner 230, tantalum nitride followed by tantalum as second liner 260 and copper or a copper alloy as a low resistivity second conductor 262. It should be noted that the second conductor 262 may be capped with a metallic layer, for example if the second conductor is copper or a copper alloy it may be capped with CoWP, CuMn, CuAl or other metallic caps which preferably inhibit electromigration flow.

Referring back to FIG. 6, the first line 242 and second line 272 occupy the same level in a back end of line structure (i.e. they are both Mx lines where x=1, 2, 3 . . . ), and this is the preferred embodiment: narrow lines of one material (refractory) and wide lines of the same level with another (lower resistivity) material. However, it is also contemplated that narrow lines and wide lines at different levels have different conductor materials. For example, lower level lines are typically narrower than higher level lines, accordingly, a lower level may have substantially all refractory metal lines, while an upper level line has a mix of refractory and low resistivity metal lines (which may or may not contact each other within the same line level), while still an uppermost level line may be all low resistivity line.

Figure 8:
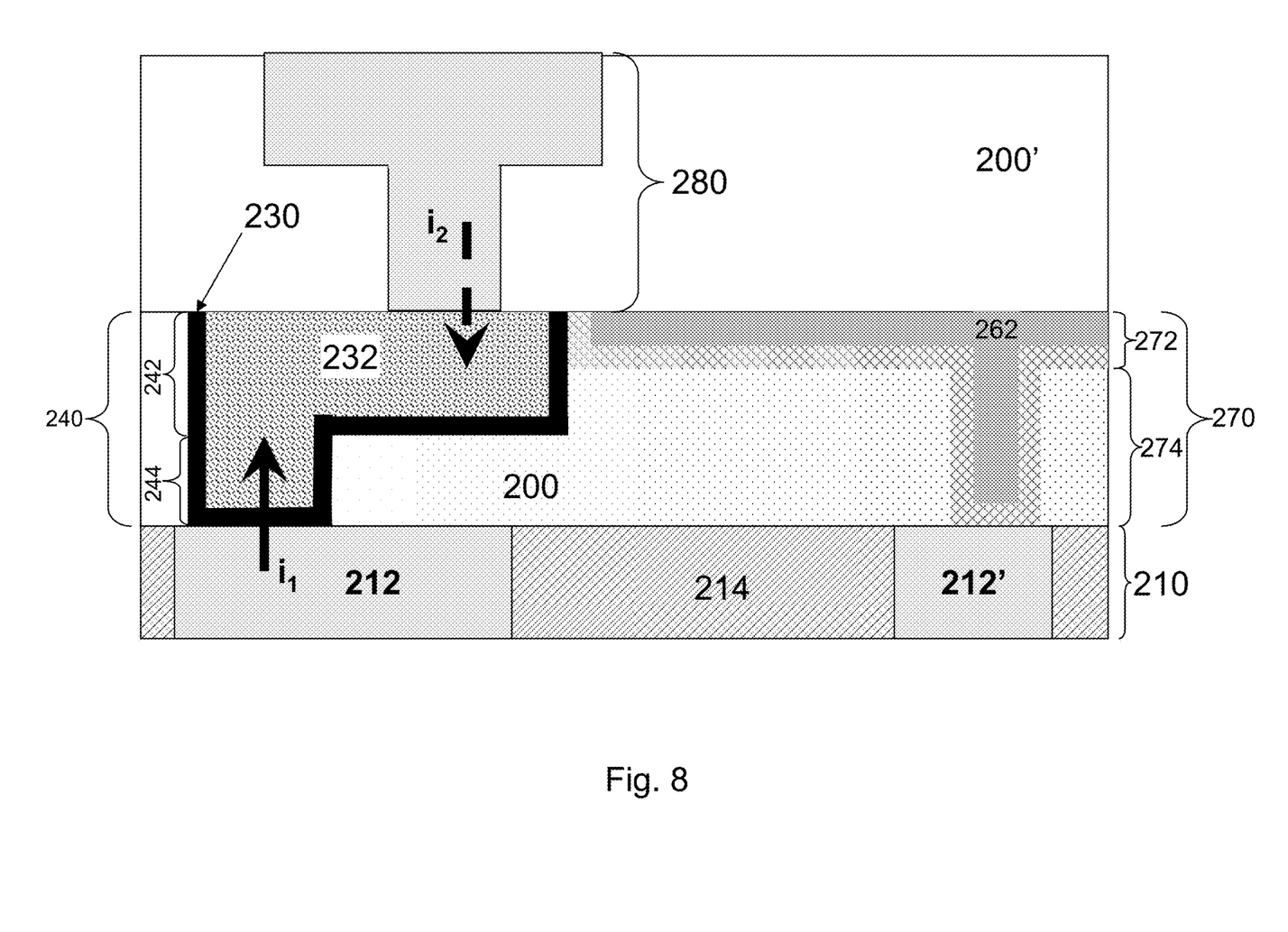
FIG. 8 illustrates, in cross section, structure having three levels of interconnects according to an embodiment of the present invention.

Referring to FIG. 8, the via and line depletion advantage of the present invention will be discussed. FIG. 8 illustrates the hybrid metallization of FIG. 6 wherein the substrate 210 includes a lower level dielectric 214 and conductors 212 and 212' ($M_{x-1}$ line level). One of the lower level conductors 212 is in contact with the first via 244. FIG. 8 also includes an upper level interconnect 280 ($M_{x+1}$ level) in contact with the first line 242. The upper level interconnect 280 is embedded in a dielectric layer 200' similar to that described in conjunction with dielectric layer 200. In a first scenario, a current ($i_1$) flows from the lower level conductor 212 through the interconnect 240 and into upper level interconnect 280; accordingly, the electrons flow in the opposite direction, namely from upper level interconnect 280 through interconnect 240 to lower level conductor 212. If the first interconnect 240 was small and made of copper, line depletion would expect to take place, meaning material would move out of the line 242 of the first interconnect 240 in response to the high current density and a void would form near the line 242 under the via of the upper level interconnect 280 causing an open or increasing the resistance to create a high resistance line. Similarly, if the current came from the opposite direction ($i_2$), meaning from the upper level interconnect 280 above (accordingly, electrons moving from lower interconnect 212 through first interconnect 240 and into upper level interconnect 280), via depletion would be expected. In via depletion mode, material would move out of the via 244 of the first interconnect 240 in response to the high current density and a void would form near the via 244 causing an open or increasing the resistance to create a high resistance via. However, because the present invention uses a refractory metal in both the line 242 and the via 244 of the interconnect 240, the interconnect 240 is protected from both line depletion and via depletion.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims including single damascene lines. The scope of the following claims is to be accorded the broadest interpretation so as to encompass all such modifications and equivalent structures and functions.

We claim:

1. A method of forming a hybrid interconnect structure comprising:
    forming a first damascene line filled with a first conductor, the first damascene line having a first line width; and
    forming a second damascene line filled with a second conductor in the same interconnection level as the first damascene line, the second damascene line having a second line width;
    wherein the first line width is less than the second line width, and the first conductor is a refractory metal, the second conductor is a copper alloy, and wherein a vertical portion of a liner of the first damascene line abuts a vertical portion of a liner of the second damascene line.

2. The method of claim 1, wherein the second conductor has a resistivity less than the first conductor.

3. The method of claim 1, wherein the first damascene line and the second damascene line are in electrical contact with each other.

4. The method of claim 1, wherein a first line opening of the first damascene line has a first line height and a second line opening of the second damascene line has a second line height wherein the first line height is greater than the second line height.

5. The method of claim 4, wherein first line height is at least 1.5 times greater than the second line height.

6. The method of claim 1, wherein an aspect ratio of the first damascene line is greater than an aspect ratio of the second damascene line.

7. A method of forming a hybrid structure comprising:
    forming a first dual damascene opening in a dielectric layer, the first dual damascene opening comprising a first line opening above a first via opening;
    forming a first liner along sidewalls and a bottom of the first dual damascene opening and on top of the dielectric layer;
    depositing a first conductor on top of the first liner within the first dual damascene opening and on top of the first liner above the dielectric layer;
    planarizing the first conductor and first liner such that upper surfaces of both the first conductor and the first liner are co-planar with an upper surface of the dielectric layer;
    forming a second dual damascene opening in the dielectric layer while protecting at least a portion of both the first conductor and the first liner, the second dual damascene opening comprising a second line opening above a second via opening, the second dual damascene opening intersects at least with a portion of the first liner such that a vertical portion of the first liner is exposed by forming the second dual damascene opening, and an aspect ratio of the first line opening is greater than an aspect ratio of the second line opening;
    forming a second liner above and covering the first conductor, and along sidewalls and a bottom of the second dual damascene opening and on top of the dielectric layer;
    depositing a second conductor on top of the second liner within the second dual damascene opening and on top of the second liner above the dielectric layer, wherein a vertical portion of the second liner is in contact with a vertical portion of the first liner such that a distance between the first conductor and the second conductor is substantially equal to a wall thickness of the first liner plus a wall thickness of the second liner; and planarizing the second conductor and second liner such that upper surfaces of both the second conductor and the second liner are co-planar with the upper surface of the dielectric layer.

8. The method of claim 7, wherein the first conductor and the second conductor are in electrical contact with each other.

9. The method of claim 7, wherein the first line opening has a first line height and the second line opening has a second line height wherein the first line height is greater than the second line height.

10. The method of claim 7, wherein the first line opening has a first line width and the second line opening has a second line width wherein the first line width is less than the second line width.

11. The method of claim 7, wherein the second conductor has a resistivity less than the first conductor.

12. The structure of claim 7, wherein the first conductor comprises a refractory metal.

* * * * *